United States Patent [19]
DeKoven et al.

[11] Patent Number: 5,609,943
[45] Date of Patent: Mar. 11, 1997

[54] NON-WETTABLE LAYER FOR COLOR FILTERS IN FLAT PANEL DISPLAY DEVICES

[75] Inventors: Benjamin M. DeKoven; Donald J. Perettie; Donald L. Schmidt; Murali Vedula, all of Midland, Mich.

[73] Assignee: The Dow Chemical Company, Midland, Mich.

[21] Appl. No.: 460,159

[22] Filed: Jun. 2, 1995

[51] Int. Cl.[6] .................................................. B32B 9/00
[52] U.S. Cl. ........................ 428/195; 428/209; 428/201; 428/1; 430/17
[58] Field of Search ................... 428/201, 1, 207, 428/209, 210, 701, 702, 195; 430/7, 293, 294, 321, 328, 329, 330; 359/588, 589

[56] References Cited

U.S. PATENT DOCUMENTS

| | | | |
|---|---|---|---|
| 4,837,098 | 6/1989 | Shimamura | 430/7 |
| 4,846,556 | 7/1989 | Haneda | 430/325 |
| 4,926,666 | 5/1990 | Gotting et al. | 72/247 |
| 5,006,624 | 4/1991 | Schmidt et al. | 526/243 |
| 5,238,747 | 8/1993 | Schmidt et al. | 428/421 |
| 5,310,581 | 5/1994 | Schmidt et al. | 427/558 |

FOREIGN PATENT DOCUMENTS

| | | |
|---|---|---|
| 59-75205 | 4/1984 | Japan. |
| 5224012 | 9/1993 | Japan. |
| 735915 | 2/1995 | Japan. |

OTHER PUBLICATIONS

Chem. Abstract of JP 06–347647, Accession number 94–347637.

*Primary Examiner*—Patrick Ryan
*Assistant Examiner*—Patrick Jewik

[57] ABSTRACT

A dispersion-preventing patterned substrate suitable for a liquid crystal display device is described. The substrate is patterned with a resin which is a cure of a coating composition comprising a solution of: a) a crosslinkable polymeric surfactant having i) at least one pendant fluorocarbon moiety, and ii) a plurality of pendant ionic moieties which are capable of reacting with counterions to form a crosslinked polymer; and b) a polymeric crosslinking agent having a plurality of ionic or potentially ionic moiety counterions capable of reacting with the ionic moieties of the surfactant, wherein the pattern defines a plurality of wells adapted to receive a coloring agent.

14 Claims, No Drawings

NON-WETTABLE LAYER FOR COLOR FILTERS IN FLAT PANEL DISPLAY DEVICES

BACKGROUND OF THE INVENTION

Color filters for liquid crystal displays are formed from small pixels in the three primary colors: red, green, and blue. These pixels can be formed by depositing colored materials on a transparent substrate within the borders of a black grid, which provides contrast and definition for the pixels. These colored materials are prepared by dispersing dyes and/or pigments into an organic-based binder. The dye or pigment dispersion (i.e., the coloring agent) is typically deposited and patterned on the substrate by photolithographic, printing, or electrodeposition methods. The black grid usually contains a chrome metal, the back surface of which is either oxidized or coated with CrO light absorbing film, or a mixture of organic pigments to form a black organic border. The border may be deposited on the substrate by means such as electrodeposition, photolithography, and printing, including ink-jet printing.

In Japanese Public Patent Disclosure Bulletin No. 5-224012, incorporated herein by reference, Matsumura discloses a method for manufacturing color filters for high-quality liquid crystal displays that can reliably prevent ink blotting and color mixing, especially in cases where the colored parts are formed by printing or ink-jet methods. Specifically, Matsumura discloses a method of manufacturing color filters for liquid crystal displays by the steps of spreading a photosensitive resin layer on a transparent substrate; exposing and photolithographically developing the resin layer to form a desired pattern; laminating an ink-repelling silicon-based rubber layer, generally a crosslinked organic polysiloxane, on top of the patterned resin layer; and removing the exposed photosensitive resin layer along with the rubber layer on top of it, thereby forming wells for the colored materials.

In Japanese Public Patent Disclosure Bulletin No. 59-75205, a technology is disclosed which uses the ink jet method to distribute "coloring matters" of three colors on the substrate. The publication also discloses that a dispersion-preventing pattern (i.e., a pattern that prevents ink-blotting and color mixing) made from a substance with poor wettability is effective, but no specific technology is disclosed.

The siloxane-containing materials are known to be wettable or swellable by many organic solvents. It would be an advance in the art to provide a substrate-adhering, dispersion-preventing pattern for a liquid crystal display device that is non-wettable by either aqueous or organic solvents.

SUMMARY OF THE INVENTION

The present invention is a dispersion-preventing patterned substrate for a liquid crystal display device comprising a non-wettable resin patterned on a transparent substrate, the resin being a cure of a coating composition comprising a solution of:
a) a crosslinkable polymeric surfactant having
 i) at least one pendant fluoroalkyl moiety, and
 ii) a plurality of pendant ionic moieties which are capable of reacting with counterions to form a crosslinked polymer, and
b) a crosslinking agent having a plurality of ionic or potentially ionic moiety counterions capable of reacting with the ionic moieties of the surfactant;
wherein the pattern defines a plurality of wells adapted to receive a coloring agent.

In another embodiment, the present invention is a process of preparing a non-wettable dispersion-preventing pattern for a liquid crystal display device comprising the steps of:
a) coating a substrate with a mixture of i) a crosslinkable polymeric fluoroalkyl surfactant having at least one pendant fluoroalkyl moiety and a plurality of pendant ionic moieties, and ii) a crosslinking agent having a plurality of counterions, wherein the pendant ionic moieties are capable of photolytically reacting with the counterions to form a crosslinked polymer;
b) masking a portion of the coating to expose a desired pattern;
c) irradiating the desired pattern with electromagnetic radiation having sufficient energy at wavelengths above 200 nm to promote sufficient reaction between the ionic moiety and the counterion to cure the exposed pattern; and
d) removing the unirradiated portion of the coating.

Substrates coated with the above-described composition provide an easier and more reliable means of manufacturing color filters.

DETAILED DESCRIPTION OF THE INVENTION

Examples of resins suitable for forming the non-wettable dispersion-preventing pattern on the substrate are disclosed in U.S. Pat. Nos. 4,929,666 and 5,006,624, both incorporated herein by reference.

The compositions used to make the patterned substrate of the present invention are preferably, but not necessarily, water-based, and the fluoroalkyl polymeric surfactant is preferably water-soluble or water-dispersible. The compositions may be dispersed or dissolved entirely in water, a mixture of water and an organic solvent, or a suitable polar organic solvent, such as an alcohol, a glycol, or a pyrrolidone.

The crosslinkable fluoroalkyl polymeric surfactant contains at least one pendant fluoroalkyl moiety and a plurality of pendant ionic moieties which are capable of reacting with counterions to form a crosslinked polymer, and is preferably represented by the structure:

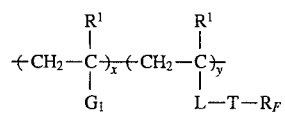

wherein $G_1$ is a reactive ionic functional group; L is a bond or a linking group; T is a $C_{1-10}$ divalent hydrocarbon group, or an inertly substituted $C_{1-10}$ divalent hydrocarbon group, wherein the substituents do not deleteriously affect the function of the reactive ionic functional group; x is an integer greater than 1 and y is a positive integer; each $R_1$ is independently H or methyl; and $R_F$ is a fluoroalkyl moiety that is preferably terminated with a $CF_3$ group. More preferably, $R_F$ is a perfluoroalkyl moiety.

The polymeric backbone is preferably a copolymer derived from a first monomer represented by the structure:

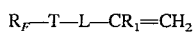

and a second monomer represented by the structure:

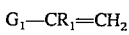

T is preferably:

—SO$_2$—NR$^2$ (CH$_2$)$_m$—, —(CH$_2$)$_m$—, —(CH$_2$)$_m$—S—(CH$_2$)$_m$—, and
—(CH$_2$)$_m$—CR(OH)—(CH$_2$)$_m$—;

wherein R is H or a C$_1$–C$_{12}$ alkyl group; R$^2$ is H or a C$_1$–C$_{10}$ alkyl group, preferably methyl or ethyl; and m is and integer from 1 to 10, preferably 1 to 4.

The polymeric backbone may optionally include non-interfering repeating units, such as those derived from styrene, acrylate, or methacrylate monomers.

Examples of linking groups are described in U.S. Pat. No. 4,929,666. Examples of aromatic linking groups include: —Ph—CH$_2$—NH—, —Ph—CH$_2$—O—, —Ph—CH$_2$—C(O)O—, —Ph—CH$_2$—OC(O), Ph—CH$_2$—NHC(O)—, and —Ph—CH$_2$—OC(O), where —Ph is a phenyl group attached to the polymeric backbone. A preferred non-aromatic linking groups, L, is —C(O)O—. Preferred first monomers are represented by the structures:

R$_F$—(CH$_2$)$_m$—O—C(O)—CR$_1$=CH$_2$

R$_F$—SO$_2$—NR$^2$(CH$_2$)$_m$—O—C(O)—CR$_1$=CH$_2$

A more preferred first monomer is 2-methyl-2-(heptadecafluoro)ethylester; a more preferred second monomer is β-carboxyethylacrylate (CH$_2$=CHCO$_2$CH$_2$CH$_2$CO$_2$H) or methacrylic acid.

The crosslinking agent has a plurality of ionic or potentially ionic moiety counterions capable of reacting with the ionic or potentially ionic moieties of the surfactant. The crosslinking agent may be a polymer derived from a monomer having the structure:

G$_2$—CR$_1$=CH$_2$ wherein R$_1$ is H or methyl, and G$_2$ comprises a reactive ionic functional group which is capable of reacting with G1 to form a covalent bond. Accordingly, G$_1$ and G$_2$ are selected to coreact to form a covalent bond. The polymer may be homopolymeric or copolymeric.

Alternatively, the crosslinking agent may be a low molecular weight polyionic compound which is capable of crosslinking the fluorinated polymeric surfactant. Examples of such polyionic compounds are dicationic compounds represented by the structures:

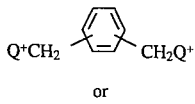

or

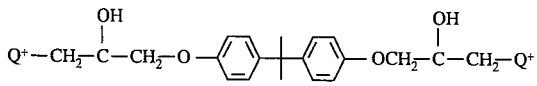

where Q$^+$ is the cationic portion of an onium salt.

Examples of suitable cationic portions for the crosslinker include ammonium, pyridinium, phosphonium, sulphonium, benzyl sulfonium, azetidinium, or aryl cyclic sulfonium groups. Functional epoxy or melamine-based compositions, which when protonated yield cationic functionality, are also suitable.

Typical anionic portions include carboxylate, phenate, carbonate, hydroxide, alkoxide, or bicarbonate groups. The crosslinking agent may also contain fluoroaliphatic moieties.

Many fluorinated polymeric surfactant-crosslinking agent compositions (FPS-CL) which contain onium salts are photolabile (see U.S. Pat. No. 4,929,666 supra, U.S. Pat. No. 5,238,747, and U.S. Pat. No. 5,310,581, incorporated herein by reference).

Either G$_1$ or G$_2$ may contain an onium group, and either may contain a potentially ionic moiety, such as a polyfunctional oxazoline or oxazine. For example, polymers of 2-isopropenyl-2-oxazoline can be formulated with the ammonium salt of a carboxylate anionic polymeric surfactant to form an amide-ester crosslink.

Patterning the Non-Wettable Layer on a Substrate

The crosslinkable coating composition described hereinabove can be patterned on the transparent substrate in a number of ways. For example, a photosensitized resin can be coated on the substrate, then exposed and developed by photolithography to form the desired pattern. Then, the crosslinkable coating composition can be coated on top of the patterned resin by any suitable technique, such as spin coating, and then cured, generally at a temperature in the range of about 50° C. to about 120° C. Finally, the patterned resin is removed along with the crosslinkable coating composition on top of it, leaving a desired pattern of the crosslinkable coating composition. The pattern is generally in the form of a framework of parallel or crisscrossed bars (i.e., a grid), the bars typically having a width of from about 10 μm, preferably about 20 μm to about 100 μm, and preferably about 30 μm.

In the case where the fluorinated polymeric surfactant/crosslinking agent composition (FPS-CL) contains a photolabile onium salt such as those disclosed in U.S. Pat. Nos. 4,929,666 and 5,310,581, the FPS-CL can be patterned on the substrate in the absence of another photosensitized resin. This photolabile FPS-CL can be coated on the transparent substrate. Then, a mask can be placed over the coating to expose a desired pattern. Next, the exposed area can be irradiated with electromagnetic radiation having sufficient energy at wavelengths above about 200 nm, preferably from about 200 nm to about 310 nm, to promote sufficient reaction between the ionic moiety and the counterion to cure the exposed area. The unexposed areas can be removed by rinsing the coating with water, leaving the photocured pattern, which can be further cured by heating.

Another method of patterning the crosslinkable coating composition is by printing, more particularly gravure, screen offset, flexographic, or ink-jet printing. Here, the desired pattern is formed by directly printing the composition onto the substrate, then curing the composition. Subtractive patterning methods, such as reactive ion etching, wet chemical etching, laser ablation, or x-ray lithography may also be used to pattern the composition on the substrate.

A blackening material is advantageously used in such a manner so as to prevent transmission of light through the pattern formed by the resin. For example, a sufficient amount of the blackening material may be mixed with the crosslinkable coating composition to provide the desired combination of contrast, definition, and non-wettability. Suitable blackening materials include dispersed pigments, which are used in black inks, and which require no preparation prior to mixing with the water-based composition; and lampblack, which is advantageously first wetted with a suitable wetting agent, such as isopropyl alcohol, then physically dispersed in the coating composition.

The coating composition can also be patterned, then cured, over a black border that has been patterned on the substrate. Such a blackening material includes an oxidized chrome metal, or a black organic border derived from a mixture of pigments or dyes. The coating composition can be patterned on top of the black matrix by any suitable mean, including a roller coating technique that deposits a thin layer specifically on top of the black matrix material.

Although the coating composition is non-wettable, it can be rendered wettable by any suitable process, such as oxygen plasma. Such a treatment would allow for the patterning of the black border over the coating composition.

Coloring agents can be more easily applied into the wells defined by the dispersion-preventing pattern of the present invention by methods, such as direct printing or ink-jet printing. In fact, coloring agents which ordinarily would be applied by high resolution printing, can advantageously be applied with a lower resolution printer, since blotting and color mixing are substantially eliminated by the non-wettable grid. A lower resolution printer has the advantage over the high resolution printer of requiring significantly lower cost and operation time.

The following is a detailed description of the preparation of a resin suitable for patterning a substrate for a liquid crystal display device. All percentages are in weight percent unless otherwise indicated.

Step 1 Preparation of an Anionic Polymeric Surfactant

An aqueous copolymer solution of 2-[ethyl-{(heptadecafluorooctyl)sulfonyl }amino ] ethyl 2-propenoate, $C_8F_{17}SO_2N(C_2H_5)CH_2CH_2OC(O)CH=CH_2$, (commercially known as FX-13, from 3M Industrial Chemical Products Div., St. Paul, Minn.) and β-carboxy-ethylacrylate (β-CEA, from Rhone-Poulenc, Cranbury, N.J.) are prepared by peroxide-initiated polymerization, under nitrogen, followed by neutralization with ammonium hydroxide and purification by dialysis.

Three solutions are prepared: (1) 30.0 g of inhibitor-free FX-13 in 10 g methyl ethyl ketone (MEK); (2) 20.0 g β-CEA in 10 g of MEK; and (3) 1.04 g 2-methylbutanenitrile (commercially known as VAZO-67, from DuPont Company, Wilmington, Del.) and 0.03 g mercaptoethanol in 16 mL of MEK.

The three solutions are continuously added with stirring to a solution of 35 g MEK and 20 g propylene glycol in a 250 mL round-bottom flask equipped with a stirrer, condenser, and pressure adjusted nitrogen inlet. The FX-13 solution is added with a 50 mL syringe pump at a rate of 13.3 g/hr. The β-CEA solution is added using a 50 mL syringe pump at 10.0 g/hr. The VAZO-67 and mercaptoethanol solution is added using a 10 mL syringe pump a 6.0 g/hr. After 3 hours, the continuous addition is completed and the solution is held at 81° C. for an additional hour. After cooling, 65 g of MEK is removed under vacuum and a 50 weight percent solution of ammonium hydroxide is added to adjust the pH to about 10. An additional 20 g of liquid is removed under vacuum and the solution is dialyzed against water for 72 hours using a Spectra/POR™ membrane tubing (m.w. cutoff 6000 to 8000).

Step 2 Preparation of an Anionic Polymeric Surfactant with Oxazoline Crosslinker A sample of the polymeric surfactant prepared by the procedure in Example 1 (3,000 g of a 10 percent solids solution) is added to 1.156 g of a 10 percent aqueous solution of an 80:20 weight ratio copolymer of 2-isopropenyl-2-oxazoline and methyl methacrylate containing 0.33 g ethylene glycol.

Step 3 Preparation of a Reactive Photocurable Anionic Polymeric Surfactant

The preparation is carried out using the same general conditions as described in Step 1. A perfluoroacrylate (30 g, FX-189, manufactured by 3-M Company), and a solution of 20 g of vinylbenzyl chloride and 5 g of MEK are added by way of the addition funnel to a stirred solution of MEK (15 mL) at 85° C. under a nitrogen purge at a rate 16 mL/hr. A solution of initiator (VAZO-64) consisting of 1.2 g in 12 mL of MEK is cooled to 0° C. and added to the reaction vessel at a rate of 4 mL/hr. After the additions are completed, the reaction mixture is stirred for an additional 3 hours, during which time an additional 10 g of MEK is added. The reaction mixture is allowed to cool to ambient temperature and the resultant polymer-containing solution is decanted away from trace solid polymer residue.

The perfluoroacrylate/vinylbenzyl chloride copolymer product is further reacted with dimethyl sulfide. To a 50 mL round-bottom flask equipped with a magnetic stirrer, a condenser, a dry ice condenser and a nitrogen inlet is added the copolymer (11.3 g, 45.4 percent copolymer in MEK) and dimethyl sulfide (4.2 g, 5 eq). This mixture is further diluted with a 1:1 THF/MEK solvent blend (10 g) and heated to 50° C. for 24 hours. During this time, small amounts of water are periodically added (about 3 mL in all). The reaction mixture was allowed to cool to ambient temperature and the excess solvent is removed in vacuo. A 1:2 v/v mixture of acetone to water is added to the product, and the mixture is stirred for 1 hour to form a clear, tan solution of the sulfonium chloride salt of the perfluorocarbon-containing polymer.

The sulfonium chloride salt is loaded into a column packed with bicarbonate anionic exchange resin to form a sulfonium bicarbonate salt to introduce the counterion crosslinking agent.

What is claimed is:

1. In a liquid crystal display device having a transparent substrate and a light transmission-preventing composition patterned over the substrate, wherein the light transmission-preventing composition comprises a blackening material and a non-wettable resin which is a cure of a coating composition which is a solution containing:

a) a crosslinkable polymeric surfactant having i) at least one pendant fluoroalkyl moiety, and ii) a plurality of pendant ionic moieties which are capable of reacting with counterions to form a crosslinked polymer; and b) a crosslinking agent having a plurality of ionic or potentially ionic moiety counterions capable of reacting with the ionic moieties of the surfactant; wherein the pattern defines a plurality of wells adapted to receive a coloring agent.

2. A dispersion-preventing patterned substrate for a liquid crystal display device comprising a non-wettable resin patterned on a transparent substrate, the resin being a cure of a coating composition comprising a solution of:

a) a crosslinkable polymeric surfactant having i) at least one pendant fluoroalkyl moiety, and ii) a plurality of pendant ionic moieties which are capable of reacting with counterions to form a crosslinked polymer; and b) a crosslinking agent which comprises a polyfunctional oxazoline or oxazine; wherein the pattern defines a plurality of wells adapted to receive a coloring agent.

3. The dispersion-preventing patterned substrate of claim 2 wherein the crosslinking agent comprises a polymer of 2-isopropenyl-2-oxazoline.

4. The dispersion-preventing patterned substrate of claim 2 which further includes a blackening material patterned over the coating composition.

5. The liquid crystal display device of claim 1 wherein the crosslinkable coating composition is water-based and the crosslinkable polymeric perfluoroalkyl surfactant is water-soluble or water-dispersible.

6. The liquid crystal display device of claim 1 wherein the crosslinkable polymer fluoroalkyl surfactant is a copolymer derived from a first monomer having the structure:

$R_F$—T—L—CR$_1$=CH$_2$ and a second monomer having the structure:

G$_1$—CR$_1$=CH$_2$ wherein G$_1$ is a reactive ionic functional group; L is a bond or a linking group; and R$_F$ is a fluoroalkyl moiety that is terminated with a CF$_3$ group; each R$_1$ is independently H or methyl; and T is a C$_{1-10}$ divalent hydrocarbon group, or an inertly substituted C$_{1-10}$ divalent hydrocarbon group.

7. The liquid crystal display device of claim 6 wherein the first monomer has the structure:

$R_F$—T—O—C(O)—CR$_1$=CH$_2$, or $R_F$—SO$_2$—NR$^2$(CH$_2$)$_m$—O—C(O)—CR$_1$=CH$_2$ wherein R$^2$ is H or a C$_1$–C$_{10}$ alkyl group, and m is an integer from 1 to 10.

8. The liquid crystal display device of claim 6 which comprises a photocured onium salt.

9. The liquid crystal display device of claim 1 wherein the crosslinking agent is a polyfunctional oxazoline or an oxazine.

10. The liquid crystal display device of claim 9 wherein the crosslinking agent is a polymer of 2-isopropenyl-2-oxazoline.

11. The liquid crystal display device of claim 1 wherein the crosslinking agent is represented by:

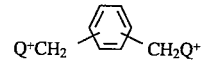

or

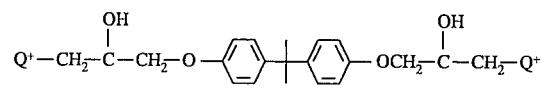

where Q$^+$ is the cationic portion of an onium salt.

12. The liquid crystal display device of claim 1 which further includes a coloring agent within the borders of the patterned resin.

13. The liquid crystal display device of claim 12 wherein the coloring agent is applied by direct printing.

14. The liquid crystal display device of claim 1, wherein the pattern is formed by direct printing, reactive ion etching, wet chemical etching, x-ray lithography, or laser ablation.

* * * * *